United States Patent
Takahashi

(10) Patent No.: US 10,658,272 B2
(45) Date of Patent: May 19, 2020

(54) METHOD FOR MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hiroaki Takahashi, Oita Oita (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/286,334

(22) Filed: Feb. 26, 2019

(65) Prior Publication Data

US 2020/0091044 A1 Mar. 19, 2020

(30) Foreign Application Priority Data

Sep. 19, 2018 (JP) .................. 2018-175444

(51) Int. Cl.
*H01L 23/495* (2006.01)
*H01L 23/00* (2006.01)
*H01L 23/535* (2006.01)

(52) U.S. Cl.
CPC ........ *H01L 23/4952* (2013.01); *H01L 23/535* (2013.01); *H01L 24/03* (2013.01); *H01L 24/05* (2013.01); *H01L 24/73* (2013.01); *H01L 24/83* (2013.01); *H01L 24/85* (2013.01); *H01L 24/92* (2013.01); *H01L 2224/031* (2013.01); *H01L 2224/04042* (2013.01); *H01L 2224/05083* (2013.01); *H01L 2224/05147* (2013.01); *H01L 2224/05155* (2013.01); *H01L 2224/05164* (2013.01); *H01L 2224/05169* (2013.01); *H01L 2224/05573* (2013.01); *H01L 2224/05644* (2013.01); *H01L 2224/73265* (2013.01); *H01L 2224/83801* (2013.01); *H01L 2224/85359* (2013.01); *H01L 2224/92247* (2013.01); *H01L 2924/014* (2013.01)

(58) Field of Classification Search
CPC ... H01L 23/4952; H01L 23/535; H01L 24/03; H01L 24/05; H01L 24/73; H01L 24/83; H01L 24/85; H01L 24/92
USPC ........................................... 438/106; 257/676
See application file for complete search history.

(56) References Cited

U.S. PATENT DOCUMENTS 6,081,310 A 6/2000 Katsuya et al.
7,452,749 B2 11/2008 Tachibana
(Continued)

FOREIGN PATENT DOCUMENTS

JP H11-218751 A 8/1999
JP 2006-279034 A 10/2006
JP 2009-76322 A 4/2009

*Primary Examiner* — Brook Kebede
(74) *Attorney, Agent, or Firm* — Kim & Stewart LLP

(57) ABSTRACT

A method for manufacturing a semiconductor device includes forming a first metal layer above a substrate of a semiconductor chip, forming a nickel layer on the first metal layer, performing a first cleaning treatment on the nickel layer with diluted hydrochloric acid having a concentration of less than 1% by weight, forming a gold layer on the nickel layer, and connecting a bonding wire to a surface of the gold layer.

20 Claims, 5 Drawing Sheets

(56) References Cited

U.S. PATENT DOCUMENTS

| | | | |
|---|---|---|---|
| 2001/0035452 A1* | 11/2001 | Test | H01L 21/288 228/180.5 |
| 2003/0129310 A1* | 7/2003 | Sinha | H01L 21/288 427/305 |
| 2005/0245070 A1* | 11/2005 | Andricacos | H01L 21/2885 438/627 |

* cited by examiner

METHOD FOR MANUFACTURING SEMICONDUCTOR DEVICE

CROSS-REFERENCE TO RELATED APPLICATION

This application is based upon and claims the benefit of priority from Japanese Patent Application No. 2018-175444, filed Sep. 19, 2018, the entire contents of which are incorporated herein by reference.

FIELD

An embodiment described herein relates generally to a method for manufacturing a semiconductor device.

BACKGROUND

A bonding wire is used to connect an electrode pad on a semiconductor chip and an external electrode such as a lead frame. One end of the bonding wire is connected to the electrode pad, and the other end is connected to the external electrode. In order to improve the reliability of the bonding wire, for example, a gold-containing metal layer with high oxidation resistance and stability is applied to a surface of the electrode pad. On the other hand, the adhesion force between the gold-containing metal layer and the base metal layer becomes weak, which may result in a lower bonding yield rate.

DETAILED DESCRIPTION

Figure 1:
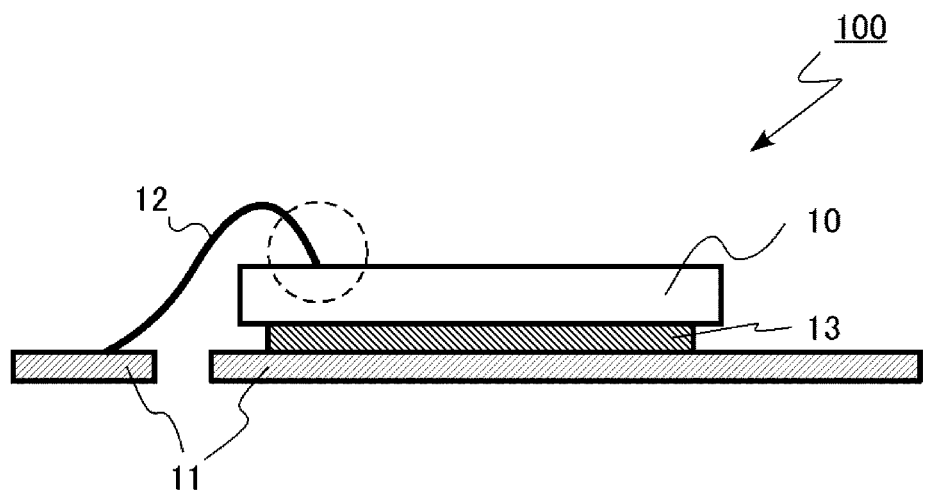
FIG. 1 is a schematic sectional view illustrating a semiconductor device manufactured by a manufacturing method according to an embodiment.

An embodiment provides a method for manufacturing a semiconductor device having a metal stacked structure with high adhesion.

In general, according to one embodiment, a method for manufacturing a semiconductor device includes forming a first metal layer above a substrate of a semiconductor chip, forming a nickel layer on the first metal layer, performing a first cleaning treatment on the nickel layer with diluted hydrochloric acid having a concentration of less than 1% by weight, forming a gold layer on the nickel layer, and connecting a bonding wire to a surface of the gold layer.

In the specification, the same signs are attached to the same or similar components, and the description thereof may be omitted.

In order to describe a positional relationship of components or the like in the specification, an upward direction of the drawing may be referred to as "up", and a downward direction of the drawing may be referred to as "down". In the specification, the concepts of "up" and "down" are not necessarily terms which indicate the relationship to the direction of gravity.

FIG. 1 is a schematic sectional view illustrating a semiconductor device manufactured by a method for manufacturing a semiconductor device according to an embodiment. A semiconductor device 100, which is manufactured by the method for manufacturing a semiconductor device according to the embodiment, includes a semiconductor chip 10, a lead frame 11, a bonding wire 12, and a solder layer 13.

The semiconductor 10 is fixed to the lead frame 11 by the solder layer 13. Further, the semiconductor 10 is electrically connected to the lead frame 11 by the bonding wire 12.

One end of the bonding wire 12 is connected to an electrode pad (not shown) provided on a surface of the semiconductor chip 10. The other end of the bonding wire 12 is connected to the lead frame 11.

The bonding wire 12 is, for example, a copper wire, a gold wire, an aluminum wire, or a copper wire coated with palladium.

Figure 2:
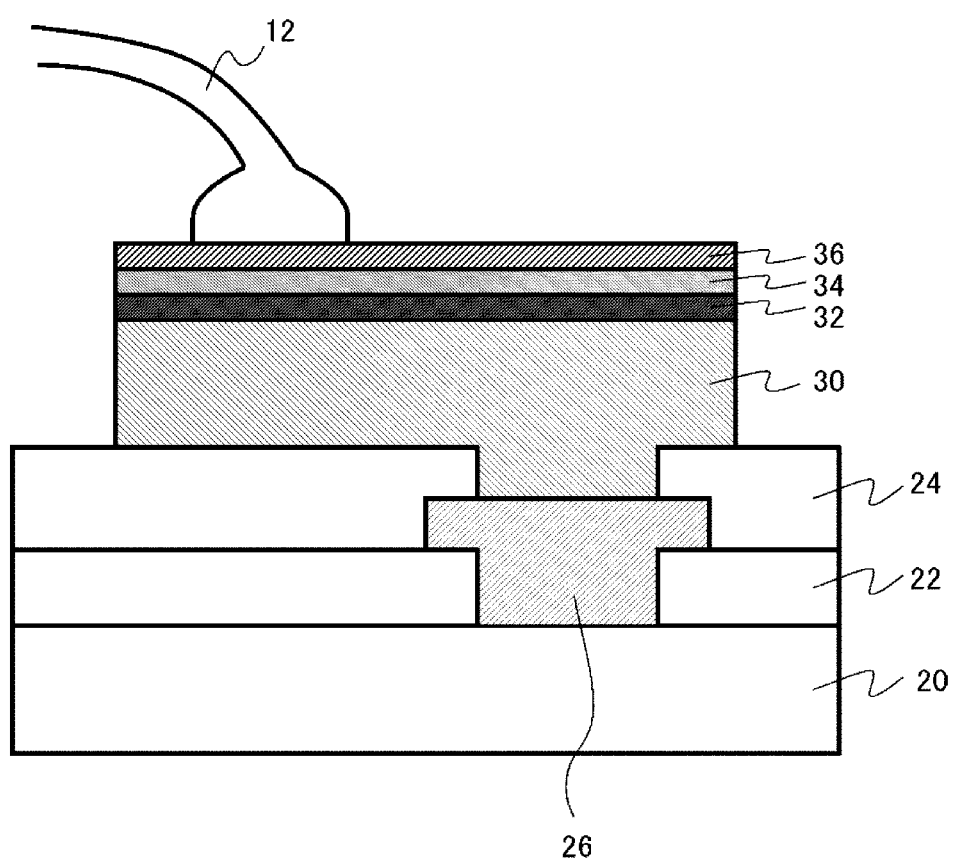
FIG. 2 is an enlarged schematic sectional view illustrating the semiconductor device manufactured by the manufacturing method according to the embodiment.

FIG. 2 is an enlarged schematic sectional view illustrating a semiconductor device manufactured by a method for manufacturing a semiconductor device according to the embodiment. FIG. 2 is an enlarged view of a portion surrounded by a dotted frame in FIG. 1. FIG. 2 is a view including an electrode pad to which the bonding wire 12 of the semiconductor chip 10 is connected.

The semiconductor chip 10 includes a silicon substrate 20, an interlayer insulating layer 22, a protective insulating layer 24, a contact electrode 26, a copper-containing metal layer 30 (also referred to as the first metal layer), a nickel-containing metal layer 32 (also referred to as the second metal layer), a palladium-containing metal layer 34 (also referred to as the fourth metal layer), and a gold-containing metal layer 36 (also referred to as the third metal layer).

The silicon substrate 20 is a monocrystalline silicon substrate. For example, a semiconductor element such as a transistor (not shown) or a diode (not shown) is formed on the silicon substrate 20.

The interlayer insulating layer 22 is provided on the silicon substrate 20. The interlayer insulating layer 22 includes, for example, silicon oxide.

The protective insulating layer 24 is provided on the interlayer insulating layer 22. The protective insulating layer 24 has, for example, a stacked structure of a silicon oxide layer and a silicon nitride layer.

An electrode pad of the semiconductor chip 10 includes the copper-containing metal layer 30, the nickel-containing metal layer 32, the palladium-containing metal layer 34, and the gold-containing metal layer 36. The copper-containing metal layer 30, the nickel-containing metal layer 32, the palladium-containing metal layer 34, and the gold-containing metal layer 36 are, for example, redistribution layers formed on the protective insulating layer 24 of the semiconductor chip 10.

The copper-containing metal layer 30 is provided on the protective insulating layer 24. The copper-containing metal layer 30 is in contact with the contact electrode 26.

The copper-containing metal layer 30 is electrically connected to the silicon substrate 20 via the contact electrode 26. The copper-containing metal layer 30 contains, for example, copper as a main component. "Copper as a main component" means that copper is an element having the highest atomic ratio among the elements contained in the copper-containing metal layer 30. A thickness of the copper-containing metal layer 30 is, for example, 5 μm or more and 20 μm or less.

The nickel-containing metal layer 32 is provided on the copper-containing metal layer 30. The nickel-containing metal layer 32 is in contact with the copper-containing metal layer 30.

The nickel-containing metal layer 32 has, for example, a function of inhibiting diffusion of copper. The nickel-containing metal layer 32 contains, for example, nickel as a main component. A thickness of the nickel-containing metal layer 32 is, for example, 1 μm or more and 2 μm or less.

The palladium-containing metal layer 34 is provided on the nickel-containing metal layer 32. The palladium-containing metal layer 34 is in contact with the nickel-containing metal layer 32.

The palladium-containing metal layer 34 has, for example, a function of inhibiting diffusion of nickel. The palladium-containing metal layer 34 contains, for example, palladium as a main component. A thickness of the palladium-containing metal layer 34 is, for example, 0.1 μm or more and 0.3 μm or less.

The gold-containing metal layer 36 is provided on the palladium-containing metal layer 34. The gold-containing metal layer 36 is in contact with the palladium-containing metal layer 34.

The gold-containing metal layer 36 has, for example, a function of improving adhesion of the bonding wire 12. A thickness of the gold-containing metal layer 36 is, for example, 0.5 μm or more and 2 μm or less.

The bonding wire 12 is connected to a surface of the gold-containing metal layer 36.

Next, a method for manufacturing a semiconductor device according to embodiments will be described. FIGS. 3, 4, 5, 6, 7, 8, and 9 are schematic sectional views of a method for manufacturing a semiconductor device according to the embodiments.

First, the interlayer insulating layer 22 is formed on the silicon substrate 20 by using a known process technique. Next, a contact hole reaching the silicon substrate 20 is formed in the interlayer insulating layer 22, and the contact electrode 26 is formed in the contact hole.

Figure 3:
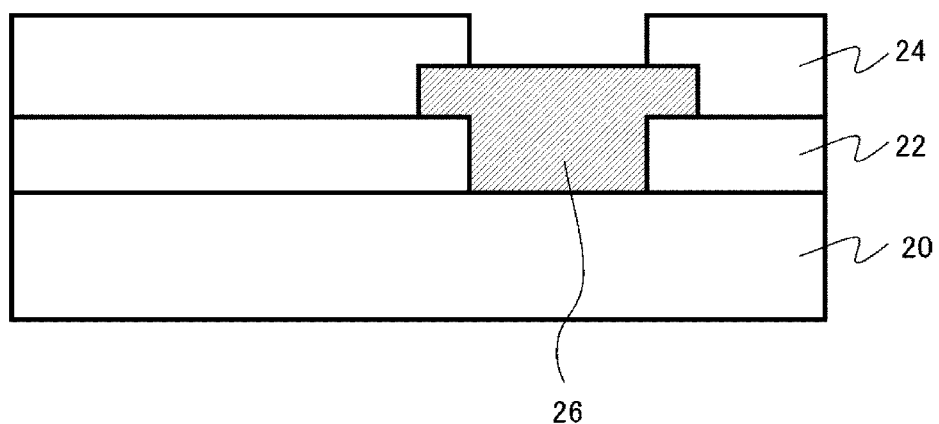
FIG. 3 is a schematic sectional view illustrating the method for manufacturing a semiconductor device according to the embodiment.

Next, the protective insulating layer 24 is formed on the interlayer insulating layer 22 and the contact electrode 26 by using a known process technique. Next, an opening is opened in the protective insulating layer 24 by using a known process technique (FIG. 3).

Figure 4:
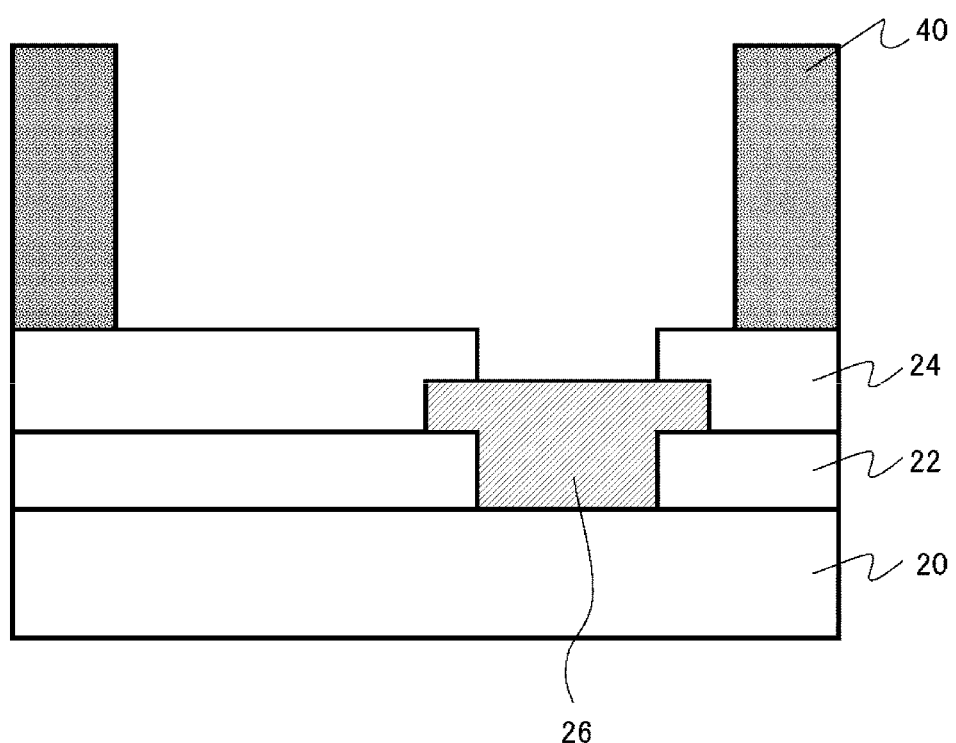
FIG. 4 is a schematic sectional view illustrating the method for manufacturing a semiconductor device according to the embodiment.

Next, a seed layer for plating (not shown) is formed on the protective insulating layer 24 and the contact electrode 26. The seed layer is, for example, a film containing titanium and copper and formed by a known sputtering method. Next, a resist 40 is patterned using a known lithography method (FIG. 4).

Figure 5:
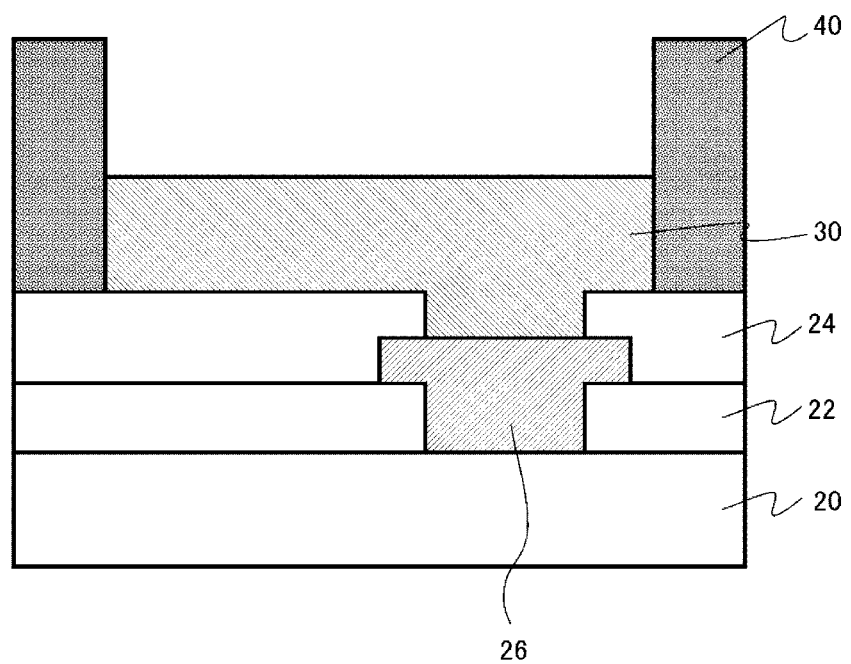
FIG. 5 is a schematic sectional view illustrating the method for manufacturing a semiconductor device according to the embodiment.

Next, the copper-containing metal layer 30 is formed in an opening of the resist 40 by, for example, a known electrolytic plating method (FIG. 5).

Figure 6:
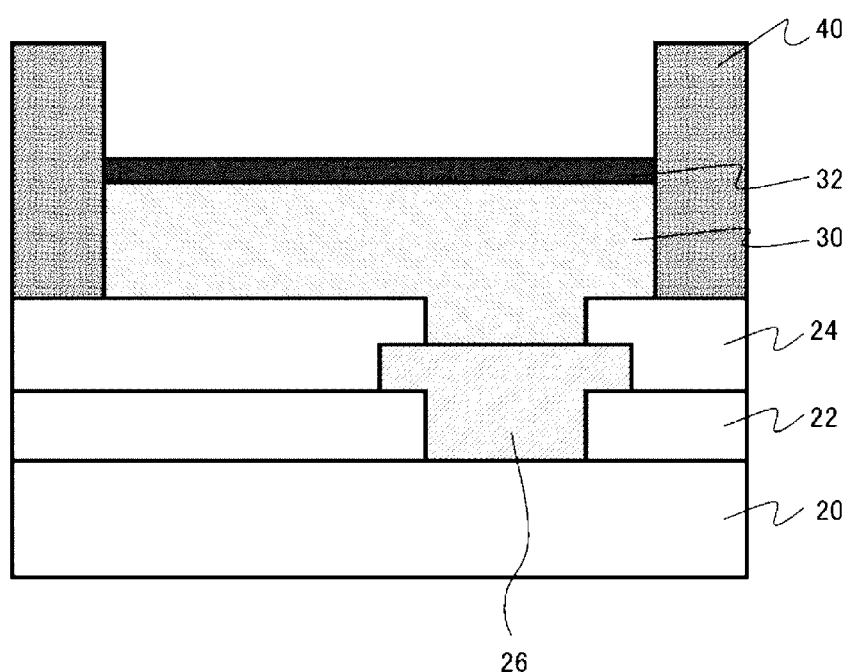
FIG. 6 is a schematic sectional view illustrating the method for manufacturing a semiconductor device according to the embodiment.

Next, the nickel-containing metal layer 32 is formed on the copper-containing metal layer 30 in the opening of the resist 40 by the known electrolytic plating method (FIG. 6).

Next, for example, a cleaning treatment is performed on the nickel-containing metal layer 32 with pure water. The residual plating solution is removed by the cleaning treatment with pure water.

Next, a first cleaning treatment is performed on the nickel-containing metal layer 32 with diluted hydrochloric acid having a concentration of less than 1% by weight. A natural oxide film formed on the surface of the nickel-containing metal layer 32 is removed by the first cleaning treatment.

A hydrochloric acid concentration of the diluted hydrochloric acid in the first cleaning treatment is, for example, 0.01% by weight or more and less than 1% by weight. The time period of the first cleaning treatment is, for example, 20 seconds or more and 120 seconds or less.

Figure 7:
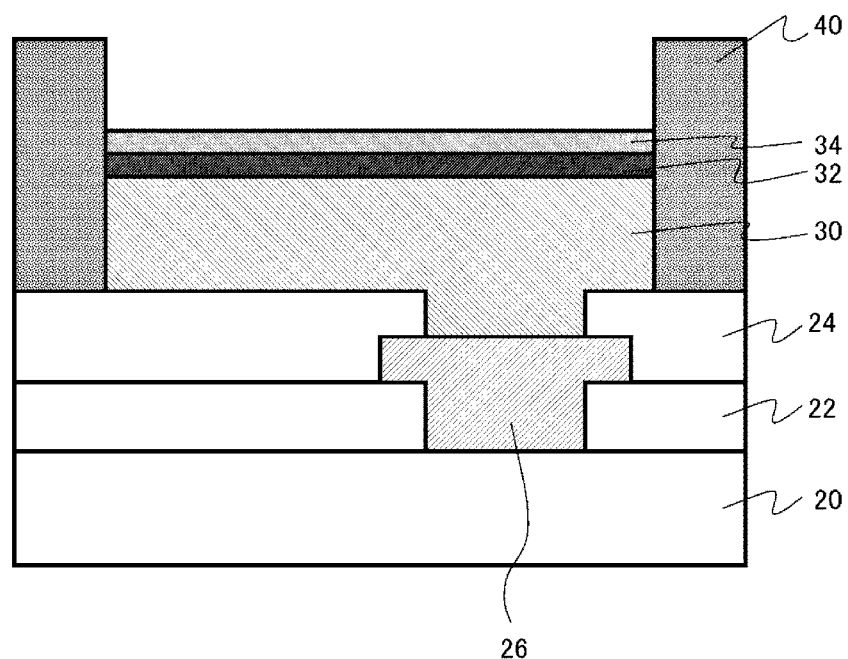
FIG. 7 is a schematic sectional view illustrating the method for manufacturing a semiconductor device according to the embodiment.

Next, the palladium-containing metal layer 34 is formed on the nickel-containing metal layer 32 in the opening of the resist 40 by the known electrolytic plating method (FIG. 7).

Next, for example, a cleaning treatment is performed on the palladium-containing metal layer 34 with pure water. The residual plating solution is removed by the cleaning treatment with pure water.

Next, a second cleaning treatment is performed on the palladium-containing metal layer 34 with a diluted hydrochloric acid having a concentration of less than 1% by weight. A natural oxide film formed on the surface of the palladium-containing metal layer 34 is removed by the second cleaning treatment.

A hydrochloric acid concentration of the diluted hydrochloric acid in the second cleaning treatment is, for example, 0.01% by weight or more and less than 1% by weight. The time period of the second cleaning treatment is, for example, 20 seconds or more and 120 seconds or less.

Figure 8:
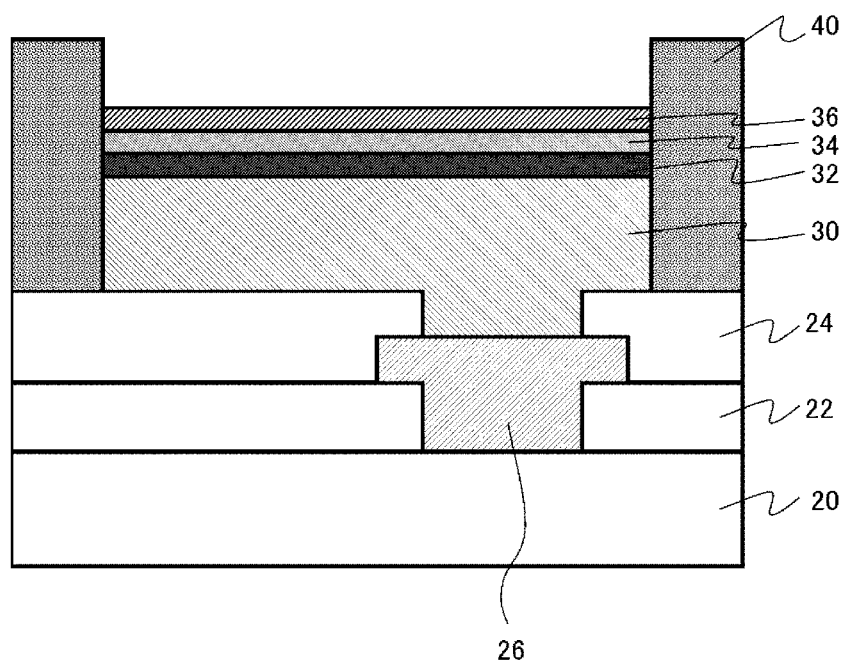
FIG. 8 is a schematic sectional view illustrating the method for manufacturing a semiconductor device according to the embodiment.

Next, the gold-containing metal layer 36 is formed on the palladium-containing metal layer 34 in the opening of the resist 40 by the known electrolytic plating method (FIG. 8).

Next, for example, a cleaning treatment is performed on the gold-containing metal layer 36 with pure water. The residual plating solution is removed by the cleaning treatment with pure water.

Figure 9:
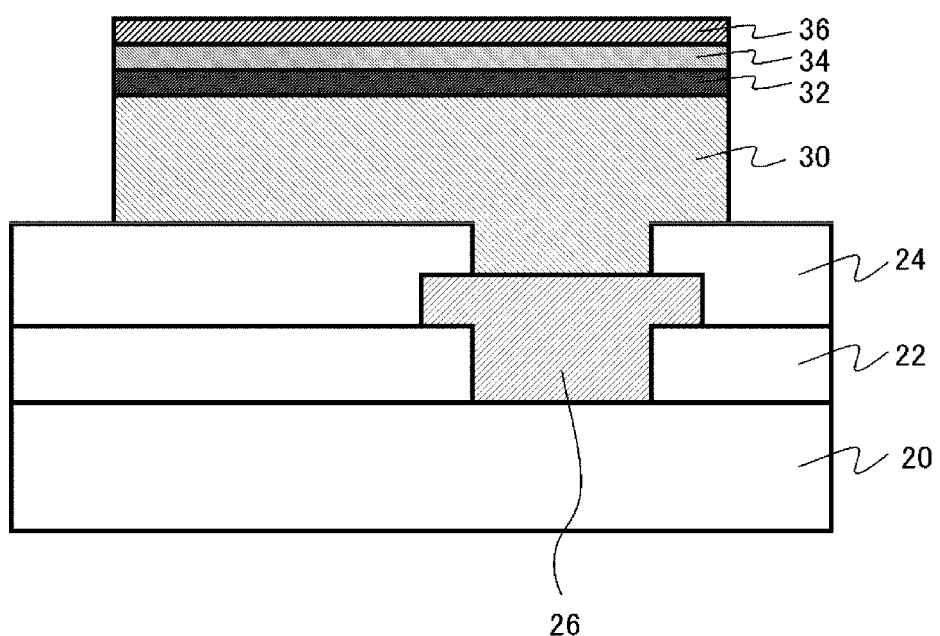
FIG. 9 is a schematic sectional view illustrating the method for manufacturing a semiconductor device according to the embodiment.

Next, the resist 40 is peeled off, and the seed layer remaining on the protective insulating layer 24 is removed by known etching (FIG. 9).

Next, the semiconductor chip 10 is fixed on the lead frame 11 by using the solder layer 13.

Next, the bonding wire 12 is connected to a surface of the gold-containing metal layer 36 by using a known wire bonder.

The semiconductor device 100 shown in FIGS. 1 and 2 is manufactured by the above manufacturing method.

Next, the function and effect of the method for manufacturing a semiconductor device according to the embodiment will be described.

In order to improve the reliability of the bonding wire, a gold-containing metal layer with high oxidation resistance and stability may be used on the surface of an electrode pad. However, the adhesion of a metal layer serving as a base of gold-containing metal layer and the gold-containing metal layer decreases, and the bonding yield may be decreased.

If the adhesion between the metal layer serving as the base of the gold-containing metal layer and gold decreases, for example, when a bonding wire is connected to the surface of the electrode pad, a film peeling of the electrode pad occurs, resulting in poor bonding.

According to the research of the present inventors, it has been found that the adhesion of the gold-containing metal layer is decreased due to the existence of a natural oxide film on the surface of the nickel-containing metal layer serving as a base of the gold-containing metal layer.

In the method for manufacturing a semiconductor device of the embodiment, after the formation of the nickel-containing metal layer 32, a first cleaning treatment is performed on the nickel-containing metal layer 32 with a diluted hydrochloric acid having a concentration of less than 1% by weight. A natural oxide film formed on the surface of the nickel-containing metal layer 32 is removed by the first cleaning treatment.

Therefore, the adhesion between the nickel-containing metal layer 32 and the palladium-containing metal layer 34 is improved. As a result, the adhesion of the gold-containing metal layer 36 is improved.

The hydrochloric acid concentration of the diluted hydrochloric acid in the first cleaning treatment is preferably 0.01% by weight or more and less than 1% by weight, more preferably 0.01% by weight or more and 0.8% by weight or less, still more preferably 0.1% by weight or more and 0.5% by weight or less, and most preferably 0.1% by weight or more and 0.3% by weight or less. The removal efficiency of the natural oxide film is improved within the above range.

If the hydrochloric acid concentration of the diluted hydrochloric acid in the first cleaning treatment exceeds 1% by weight, an amount of active oxygen in the diluted hydrochloric acid increases, and the oxidation of the surface of the nickel-containing metal layer 32 proceeds during the first cleaning treatment. Therefore, it is preferable that the hydrochloric acid concentration of the diluted hydrochloric acid in the first cleaning treatment does not exceed 1% by weight.

The time period of the first cleaning treatment is preferably 20 seconds or more and 120 seconds or less. The removal efficiency of the natural oxide film is improved within the above range.

As described above, according to the method for manufacturing a semiconductor device of the embodiment, the adhesion of the gold-containing metal layer of the electrode pad is improved. Therefore, the method allows manufacturing a semiconductor device having a metal stacked structure with high adhesion. Therefore, the semiconductor device can be manufactured with high bonding yield.

The embodiment has shown an example where the first metal layer is the copper-containing metal layer 30. Alternatively, the first metal layer may be a metal layer containing another metal, for example, a palladium-containing metal layer.

The embodiment has shown an example where the fourth metal layer is a palladium-containing metal layer 34. Alternatively, the fourth metal layer may be a metal layer containing another metal, for example, a platinum-containing metal layer.

The embodiment has shown an example where the bonding wire is connected onto the gold-containing metal layer 36. Alternatively, the present disclosure may also be applied to, for example, a case where another connecting member, for example, a solder ball or the like, is connected onto the gold-containing metal layer 36.

The embodiment has shown an example where the first to fourth metal layers are formed by an electric field plating method. Alternatively, an electroless plating method may be used. Further, methods other than the plating method may also be used, such as sputtering and vapor deposition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, components in one embodiment may be replaced or exchanged with components in any other embodiment. The accompanying claims and their equivalents are intended to cover such forms or modifications as would fall within the scope and spirit of the inventions.

What is claimed is:

1. A method for manufacturing a semiconductor device, the method comprising:
   forming a first metal layer above a substrate of a semiconductor chip;
   forming a nickel layer on the first metal layer;
   performing a first cleaning treatment on the nickel layer with diluted hydrochloric acid having a concentration of less than 1% by weight;
   forming a gold layer on the nickel layer; and
   connecting a bonding wire to a surface of the gold layer.

2. The method according to claim 1, further comprising:
   fixing the semiconductor chip on a lead frame with a solder layer, wherein
   the bonding wire connects the surface of the gold layer to another lead frame.

3. The method according to claim 1, wherein
   the first metal layer is a copper layer.

4. The method according to claim 1, further comprising:
   forming a second metal layer between the nickel layer and the gold layer.

5. The method according to claim 4, wherein
   the second metal layer is a palladium layer or a platinum layer.

6. The method according to claim 4, further comprising:
   performing a second cleaning treatment on the second metal layer with diluted hydrochloric acid having a concentration of less than 1% by weight.

7. The method according to claim 1, wherein
   the first cleaning treatment is performed for 20 seconds or more and 120 seconds or less.

8. The method according to claim 1, wherein
   the first cleaning treatment is performed with a diluted hydrochloric acid having a concentration of 0.5% by weight or less.

9. The method according to claim 1, further comprising:
   forming an insulating layer on the substrate, and
   forming a contact hole for a contact electrode, reaching the substrate in the insulating layer.

10. The method according to claim 1, wherein
    the first metal layer contacts the contact electrode formed in the contact hole.

11. A semiconductor device comprising:
    a substrate of a semiconductor chip;
    a first metal layer above the substrate;
    a nickel layer on the first metal layer, on which a first cleaning treatment is performed with diluted hydrochloric acid having a concentration of less than 1% by weight;
    a gold layer on the nickel layer; and
    a bonding wire connected to a surface of the gold layer.

12. The semiconductor device according to claim 11, wherein
the semiconductor chip is fixed on a lead frame with a solder layer, and
the bonding wire connects the surface of the gold layer to another lead frame.

13. The semiconductor device according to claim 11, wherein
the first metal layer is a copper layer.

14. The semiconductor device according to claim 11, further comprising:
a second metal layer between the nickel layer and the gold layer.

15. The semiconductor device according to claim 14, wherein
the second metal layer is a palladium layer or a platinum layer.

16. The semiconductor device according to claim 14, wherein
a second cleaning treatment is performed on the second metal layer with diluted hydrochloric acid having a concentration of less than 1% by weight.

17. The semiconductor device according to claim 11, wherein
the first cleaning treatment is performed for 20 seconds or more and 120 seconds or less.

18. The semiconductor device according to claim 11, wherein
the first cleaning treatment is performed with a diluted hydrochloric acid having a concentration of 0.5% by weight or less.

19. The semiconductor device according to claim 11, further comprising:
an insulating layer on the substrate, and
a contact electrode in a contact hole of the insulating layer, contacting the substrate.

20. The semiconductor device according to claim 11, wherein
the first metal layer contacts the contact electrode.

* * * * *